(12) United States Patent
Fukada et al.

(10) Patent No.: US 11,107,892 B2
(45) Date of Patent: Aug. 31, 2021

(54) SIC EPITAXIAL WAFER AND METHOD FOR PRODUCING SAME

(71) Applicants: SHOWA DENKO K.K., Tokyo (JP); Central Research Institute of Electric Power Industry, Tokyo (JP); DENSO CORPORATION, Kariya (JP)

(72) Inventors: Keisuke Fukada, Chichibu (JP); Naoto Ishibashi, Chichibu (JP); Akira Bando, Chichibu (JP); Masahiko Ito, Yokosuka (JP); Isaho Kamata, Yokosuka (JP); Hidekazu Tsuchida, Yokosuka (JP); Kazukuni Hara, Kasugai (JP); Masami Naito, Inazawa (JP); Hideyuki Uehigashi, Nagoya (JP); Hiroaki Fujibayashi, Kariya (JP); Hirofumi Aoki, Toyota (JP); Toshikazu Sugiura, Okazaki (JP); Katsumi Suzuki, Nagakute (JP)

(73) Assignees: SHOWA DENKO K.K., Tokyo (JP); Central Research Institute Of Electric Power Industry, Tokyo (JP); DENSO CORPORATION, Aichi (JP)

( * ) Notice: Subject to any disclaimer, the term of this patent is extended or adjusted under 35 U.S.C. 154(b) by 0 days.

(21) Appl. No.: 16/616,780

(22) PCT Filed: Apr. 19, 2018

(86) PCT No.: PCT/JP2018/016123
§ 371 (c)(1),
(2) Date: Nov. 25, 2019

(87) PCT Pub. No.: WO2018/216407
PCT Pub. Date: Nov. 29, 2018

(65) Prior Publication Data
US 2020/0083330 A1    Mar. 12, 2020

(30) Foreign Application Priority Data
May 26, 2017    (JP) .............................. JP2017-104625

(51) Int. Cl.
*H01L 29/16*    (2006.01)
*C23C 16/42*    (2006.01)
(Continued)

(52) U.S. Cl.
CPC .......... *H01L 29/1608* (2013.01); *C23C 16/42* (2013.01); *C30B 29/36* (2013.01); *H01L 21/02529* (2013.01)

(58) Field of Classification Search
CPC ........... H01L 29/1608; H01L 21/02529; H01L 21/02378; C23C 16/325
See application file for complete search history.

(56) References Cited

U.S. PATENT DOCUMENTS 9,988,738 B2 *   6/2018   Tomita ................ H01L 21/0262
2010/0147212 A1 *  6/2010  Nakabayashi .......... C30B 23/00
                                                      117/84
(Continued)

FOREIGN PATENT DOCUMENTS

CN    101194052 A    6/2008
CN    102576666 A    7/2012
(Continued)

OTHER PUBLICATIONS

Tetsuya Miyazawa et al., "Thick 4H—SiC Epitaxial Growth and Defect Reduction for Very High Voltage Bipolar Devices," ECS Journal of Solid State Science and Technology, 2013, pp. N3036-N3040, vol. 2, No. 8 (Year: 2013).*
(Continued)

*Primary Examiner* — Nicholas J Tobergte
(74) *Attorney, Agent, or Firm* — Sughrue Mion, PLLC

(57) ABSTRACT

A method for producing a SiC epitaxial wafer according to the present embodiment includes: an epitaxial growth step of
(Continued)

growing the epitaxial layer on the SiC single crystal substrate by feeding an Si-based raw material gas, a C-based raw material gas, and a gas including a Cl element to a surface of a SiC single crystal substrate, in which the epitaxial growth step is performed under growth conditions that a film deposition pressure is 30 torr or less, a Cl/Si ratio is in a range of 8 to 12, a C/Si ratio is in a range of 0.8 to 1.2, and a growth rate is 50 μm/h or more from an initial growth stage.

7 Claims, 6 Drawing Sheets

(51) Int. Cl.
　　　*C30B 29/36*　　　(2006.01)
　　　*H01L 21/02*　　　(2006.01)

(56) References Cited

U.S. PATENT DOCUMENTS

| | | | | |
|---|---|---|---|---|
| 2015/0354090 | A1* | 12/2015 | Tomita | H01L 21/0262 117/89 |
| 2018/0016706 | A1* | 1/2018 | Norimatsu | H01L 21/205 |
| 2019/0376206 | A1* | 12/2019 | Fukada | C30B 29/36 |

FOREIGN PATENT DOCUMENTS

| | | |
|---|---|---|
| CN | 104246979 A | 12/2014 |
| JP | 2011-219298 A | 11/2011 |
| JP | 2011-219299 A | 11/2011 |
| JP | 2015-510691 A | 4/2015 |
| JP | 2015-521378 A | 7/2015 |
| KR | 10-2015-0025648 A | 3/2015 |
| WO | 2013/115711 A2 | 8/2013 |
| WO | 2014/043104 A1 | 3/2014 |
| WO | 2014/125550 A1 | 8/2014 |

OTHER PUBLICATIONS

Tsutomu Hori et al., "Fast homoepitaxial growth of 4H—SiC with low basal-plane dislocation density and low trap concentration by hot-wall chemical vapor deposition," Journal of Crystal Growth, 2007, pp. 297-302, vol. 306.

Y. Ishida et al., "Influence of C/Si ratio on the 4H—SiC (0001) epitaxial growth and a keynote for high-rate growth," Materials Science Forum, 2004, pp. 213-216, vol. 457-460.

Tetsuya Miyazawa et al., "Thick 4H—SiC Epitaxial Growth and Defect Reduction for Very High Voltage Bipolar Devices," ECS Journal of Solid State Science and Technology, 2013, pp. N3036-N3040, vol. 2, No. 8.

Anusha Balachandran et al., "Basal Plane Dislocation Free Recombination Layers on Low-Doped Buffer Layer for Power Devices," Crystal Growth & Design, 2017, pp. 1550-1557, vol. 17.

Ian D. Booker et al., "Chloride-based SiC growth on α-axis 4H—SiC substrates," Physica B, 2016, pp. 23-25, vol. 480.

Galyna Melnychuk et al., "Role of Cl/Si ratio in the low-temperature chloro-carbon epitaxial growth of SiC," Materials Science Forum, 2013, pp. 205-208, vols. 740-742.

International Search Report of PCT/JP2018/016123 dated Jul. 24, 2018.

Communication dated Jan. 21, 2021, from the China National Intellectual Property Administration in application No. 201880032744.8.

* cited by examiner

100 μm

100 μm

100 μm

100 μm

50 μm

50 μm

100 μm

100 μm

100 μm

SIC EPITAXIAL WAFER AND METHOD FOR PRODUCING SAME

TECHNICAL FIELD

The present invention relates to a SiC epitaxial wafer and a method for producing the same.

Priority is claimed on Japanese Patent Application No. 2017-104625, filed on May 26, 2017, the content of which is incorporated herein by reference.

BACKGROUND ART

Silicon carbide (SiC) has features such that a dielectric breakdown field is larger by one order of magnitude, a band gap is three times larger, and a thermal conductivity is approximately three times higher than those of silicon (Si). Therefore, application of silicon carbide (SiC) to power devices, high-frequency devices, high-temperature operation devices, and the like is expected.

In order to promote the practical application of SiC devices, it is essential to establish techniques for high-quality epitaxial growth and high-quality SiC epitaxial wafers.

The SiC device is prepared by using a SiC epitaxial wafer wherein an epitaxial layer (film) to be an active region of the device is grown by a chemical vapor deposition (CVD) method or the like on a SiC single crystal substrate obtained by processing a SiC bulk single crystal which is grown by a sublimation-recrystallization method.

More specifically, a 4H epitaxial layer is grown such that step-flow growth (lateral growth from an atomic step) is carried out on the SiC single crystal substrate using a plane thereof which has an off-angle in <11-20> direction from (0001) plane as a growth surface.

In the SiC epitaxial wafer, a basal plane dislocation (BPD) is known as one of device killer defects which cause fatal defects in the SiC device.

Most of the basal plane dislocations in the SiC single crystal substrate are converted into threading edge dislocations (TED) when the epitaxial layer is formed. On the other hand, part of basal plane dislocations, which continues from the SiC single crystal substrate to the epitaxial layer as it is, is resulted in a device killer defect.

Therefore, the studies of reducing a ratio of basal plane dislocations, which continues from the SiC single crystal substrate to the epitaxial layer, and reducing a device killer defect are performed.

For example, Patent Document 1 discloses that 10 dislocations/$cm^2$ or less of a basal plane dislocation density in a 3-inch SiC epitaxial wafer can be achieved, when thermal stress is applied so as to change migration of atoms attached to a SiC single crystal substrate by controlling a temperature in a crystal growth process.

In addition, for example, Patent Document 2 discloses that 10 dislocations/$cm^2$ or less of a basal plane dislocation density in a SiC epitaxial wafer can be achieved by controlling parameters such as reactant concentration, pressure, temperature, gas flow and the like of CVD in a crystal growth process.

Furthermore, for example, Non Patent Document 1 discloses that by setting a growth rate of an epitaxial layer to 50 μm/h, it is possible to reduce a ratio of BPDs transferred from the SiC single crystal substrate to the epitaxial layer to 1%. At the current level of technology, the density of basal plane dislocations existing on a surface of a 6-inch SiC single crystal substrate is about 100 to 5000 dislocations/$cm^2$. For this reason, setting the ratio to 1% means that the basal plane dislocations of 10 to 50 dislocations/$cm^2$ are generated at the surface of the SiC epitaxial wafer.

In step flow growth, it is known that when a foreign matter such as a two-dimensional nucleus is generated on a terrace, the lateral growth of atomic steps is disturbed and crystal defects are generated. In Patent Document 3, a method of promoting decomposition and re-evaporation of a two-dimensional nucleus by adopting a step of changing conditions so as to decompose and re-evaporate SiC is proposed. In addition, in Patent Document 3, it is disclosed that adhesion of Si droplets (silicon droplets) is considered to cause high-density abnormal growth nucleus. In Non Patent Document 2, a condition under which epitaxial growth with a mirror surface is obtained at a high growth rate is studied, and it is described that a condition range of a C/Si ratio at which the mirror surface is obtained is narrow under the high growth rate condition.

CITATION LIST

Patent Literature

Patent Document 1: Japanese Unexamined Patent Application, First Publication No. 2011-219299
Patent Document 2: Japanese Translation of PCT International Publication No. 2015-521378
Patent Document 3: Japanese Unexamined Patent Application, First Publication No. 2011-219298

Non-Patent Literature

Non Patent Document 1: T. Hori, K. Dannno and T. Kimoto. Journal of Crystal Growth, 306 (2007) 297-302.
Non Patent Document 2: Y. Ishida, T. Takahashi, K. Kojima et. al. Materials Science Forum Vol. 457-460 (2004) pp 213-216.

DISCLOSURE OF INVENTION

Technical Problem

In recent years, in order to increase the number of SiC devices obtained from one epitaxial wafer and reduce the manufacturing cost, an attempt is being performed to increase the size of the SiC epitaxial wafer to 6-inch or more. Accordingly, there is a demand for a low basal plane dislocation density even in a large SiC epitaxial wafer of 6-inch or more.

However, each of the SiC epitaxial wafers disclosed in above Patent Documents has the SiC epitaxial wafer size of 6-inch or less. When the above described conditions are simply applied to the size of 6-inch, since a substrate area is large, film forming conditions vary in a plane of the SiC single crystal substrate. Therefore, the same result as 4-inch is not obtained.

In addition, in order to increase the growth rate, it is required to supply a large amount of silicon raw material, and Si droplets are easily generated. Therefore, when the growth rate is high, a locally excessive silicon region may be generated, even under a condition in which the high-density abnormal growth nucleus disclosed in Patent Document 3 is not generated. As a result, Si droplets are generated on a growth surface, and defects caused by Si droplets are formed. In recent years, high-quality epitaxial wafers are demanded. Therefore, such defects need to be reduced, even though the defects are caused by local Si droplets which are micro-defects. Furthermore, it is required to eliminate basal plane dislocations, which are device killer defects, from the epitaxial layer as much as possible.

The present invention has been made in view of the above problems. An object of the present invention is to obtain a SiC epitaxial wafer having fewer basal plane dislocations, which result in device killer defects, and having fewer defects caused by Si droplets, and to obtain a method for producing the same.

Solution to Problem

As a result of intensive studies, the inventors of the present invention found that under epitaxial growth conditions at a high growth rate, the SiC epitaxial wafer which has a small number of basal plane dislocations and has a small number of defects caused by Si droplets can be obtained by maintaining a constant C/Si ratio and increasing the Cl/Si ratio.

Accordingly, the present invention provides the following means in order to solve the above problems.

(1) A SiC epitaxial wafer according to a first aspect includes a SiC single crystal substrate of which a main surface has an off-angle of 0.4° to 5° with respect to (0001) plane; and an epitaxial layer provided on the SiC single crystal substrate, in which in the epitaxial layer, a basal plane dislocation density of a basal plane dislocation which continues from the SiC single crystal substrate to an outer surface is 0.1 dislocations/cm$^2$ or less, and a defect density caused by Si droplets is 0.1 defects/cm$^2$ or less.

The SiC epitaxial wafer of the first aspect preferably includes the following features. It is also preferable to combine the features with each other.

(2) In the SiC epitaxial wafer according to the above aspect, the defect caused by the Si droplets may be pits which exist in a scattered manner, and/or a collective defect in which pits are arranged in a direction perpendicular to an off-direction in an in-plane direction of the SiC single crystal substrate.

(3) In the SiC epitaxial wafer according to the above aspect, the defect density caused by Si droplets may be zero defects/cm$^2$.

(4) In the SiC epitaxial wafer according to the above aspect, a total basal plane dislocation density of the basal plane dislocation which continues from the SiC single crystal substrate to the outer surface and a basal plane dislocation which is converted into a threading edge dislocation in the epitaxial layer may be 0.1 dislocations/cm$^2$ or less.

(5) In the SiC epitaxial wafer according to the above aspect, a diameter of the SiC single crystal substrate may be 150 mm or more.

(6) A method for producing a SiC epitaxial wafer according to a second aspect, in which crystal growth of an epitaxial layer is carried out on a SiC single crystal substrate of which a main surface has an off-angle of 0.4° to 5° with respect to (0001) plane, includes an epitaxial growth step of growing the epitaxial layer on the SiC single crystal substrate by feeding an Si-based raw material gas, a C-based raw material gas, and a gas including a Cl element to a surface of the SiC single crystal substrate, in which the epitaxial growth step is performed under growth conditions that a film deposition pressure is 30 torr or less, a Cl/Si ratio is in a range of 6 to 12, a C/Si ratio is in a range of 0.8 to 1.2, and a growth rate is 50 µm/h or more from an initial growth stage.

The method for producing a SiC epitaxial wafer according to the second aspect preferably includes the following features. It is also preferable to combine the features with each other.

(7) In the method for producing a SiC epitaxial wafer according to the above aspect, the method may further include a cleaning step of cleaning a surface of the SiC single crystal substrate by heating the surface to 1550° C. to 1650° C. in a hydrogen atmosphere under a pressure of 30 torr or less, before the epitaxial growth step.

(8) In the method for producing a SiC epitaxial wafer according to the above aspect, the gas including the Cl element may also serve as the Si-based raw material gas.

Advantageous Effects of Invention

The SiC epitaxial wafer of the present invention can achieve a low basal plane dislocation defect density having a significant effect on a device operation of the SiC device, and a high device yield and quality.

BEST MODE FOR CARRYING OUT THE INVENTION

Figure 1:
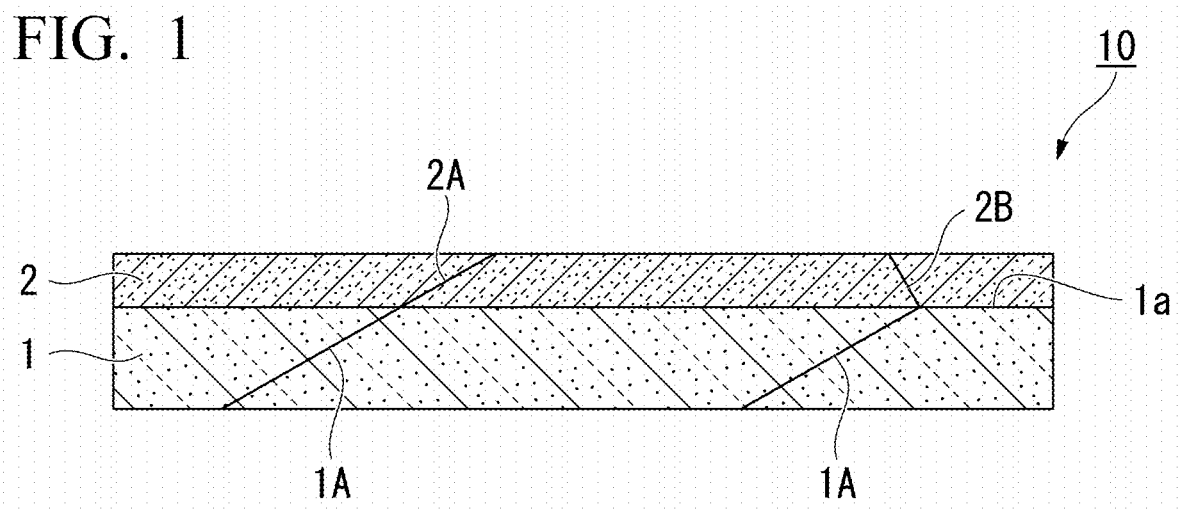
FIG. 1 is a schematic cross-sectional view of a SiC epitaxial wafer for explaining a basal plane dislocation and a threading edge dislocation.

Hereinafter, a SiC epitaxial wafer and a method for producing the SiC epitaxial wafer according to the present embodiment will be described in detail with reference to the drawings as necessary. In the drawings used in the following descriptions, for ease of understanding features of the present invention, portions having the features may be enlarged for convenience. The dimension and the ratio of each component may be the same as or different from the actual dimension. The materials, dimensions, positions, and the like exemplified in the following description are examples. The present invention is not limited thereto and can be performed in appropriately modified manners in a range having no change the gist thereof.

(Basal Plane Dislocation (BPD) and Threading Edge Dislocation (TED))

FIG. 1 is a schematic cross-sectional view of a SiC epitaxial wafer for explaining a basal plane dislocation and a threading edge dislocation.

A SiC epitaxial wafer 10 shown in FIG. 1 has an epitaxial layer 2 disposed on a SiC single crystal substrate 1.

A basal plane dislocation (BPD) 1A exists in the SiC single crystal substrate 1. The basal plane dislocation literally means a dislocation existing in (0001) plane (c-plane) which is a basal plane of a SiC single crystal. In general, the SiC single crystal substrate 1 has a surface having an offset-angle in <11-20> direction from (0001) as a growth surface 1a. Therefore, the basal plane dislocation 1A in FIG. 1 is inclined with respect to the growth surface 1a.

Figure 2A:
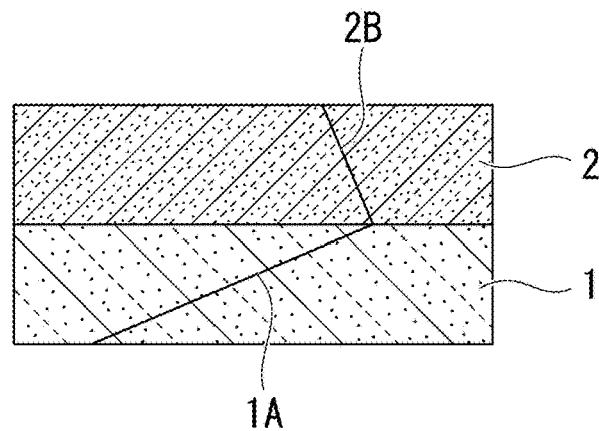
FIG. 2A is a view schematically showing behavior of dislocations at an interface between a SiC single crystal substrate and an epitaxial layer and inside the epitaxial layer.
Figure 2B:
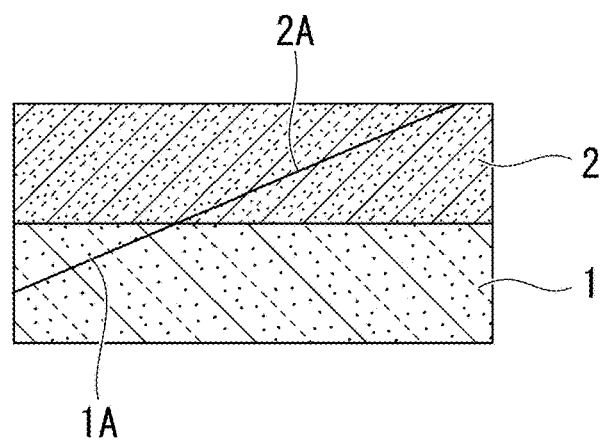
FIG. 2B is a view schematically showing behavior of dislocations at the interface between the SiC single crystal substrate and the epitaxial layer and inside the epitaxial layer.
Figure 2C:
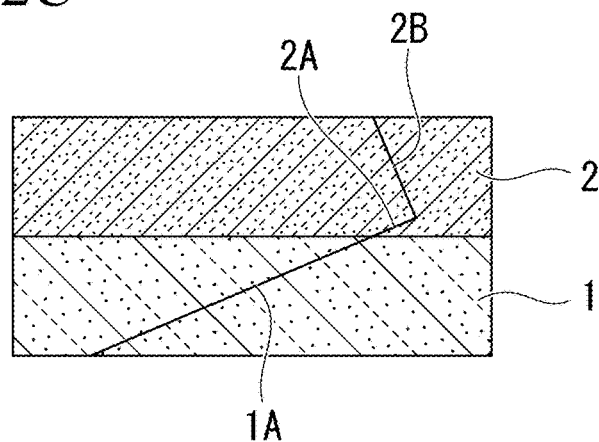
FIG. 2C is a view schematically showing behavior of dislocations at the interface between the SiC single crystal substrate and the epitaxial layer and inside the epitaxial layer.

The basal plane dislocation 1A in the SiC single crystal substrate 1 has an effect on the epitaxial layer 2 when the layer is epitaxially grown, and the dislocation exhibits the following three behaviors in the epitaxial layer 2. FIGS. 2A to 2C are views schematically showing behaviors of dislocations at an interface between the SiC single crystal substrate 1 and the epitaxial layer 2 and inside the epitaxial layer 2.

A first behavior, as shown in FIG. 2A, is a behavior in which the basal plane dislocation 1A is converted into a threading edge dislocation (TED) 2B at the interface between the basal plane dislocation 1A and the epitaxial layer 2.

A second behavior, as shown in FIG. 2B, is a behavior in which the basal plane dislocation 1A continues to the epitaxial layer 2 with no change. The dislocation continued into the epitaxial layer 2 becomes a basal plane dislocation 2A.

A third behavior, as shown in FIG. 2C, is a behavior in which the basal plane dislocation 2A is converted into the threading edge dislocation 2B inside the epitaxial layer 2.

The basal plane dislocation and the threading edge dislocation have the same Burgers vector and are convertible to each other. The threading edge dislocation is a crystal defect in which the Burgers vector indicating a displacement direction of the crystal is orthogonal to a dislocation line. The shape of the crystal defect is a shape in which one extra atomic plane is inserted into a perfect crystal surface in a blade shape.

The basal plane dislocation in the epitaxial layer adversely affects the SiC device. For example, in a case where a current flows in a bipolar device having a basal plane dislocation in a forward direction, defects expand while forming shockley stacking faults, and thus properties of the device in the forward direction is degraded.

Therefore, the first behavior of three behaviors shown in FIG. 2A has the smallest effect on the SiC device. On the other hand, the second behavior of three behaviors shown in FIG. 2B has the largest effect on the SiC device.

In a case of the third behavior shown in FIG. 2C, the effect on the device is limited as compared with the case in FIG. 2B, but it is preferable that the effect is small, and more preferable that there is no effect. When the epitaxial growth layer is sufficiently thick, recombination is not performed at a portion where the basal plane dislocation 2A exists in the epitaxial layer 2. Therefore, the possibility that the basal plane dislocation is converted into stacking fault is decreased. However, when the epitaxial layer 2 is thick, forward resistance of the device becomes high. Therefore, the epitaxial layer 2 is designed to have a thickness necessary for the withstand voltage design and to be as thin as possible. Accordingly, in order to prevent deterioration of the device features during high current conduction, which is caused due to the stacking faults which is formed by the basal plane dislocations 2A which remain in the epitaxial layer 2, it is preferable that there are few basal plane dislocations 2A during epitaxial growth, and more preferable that there are no basal plane dislocations.

As described above, in order to avoid effects on the SiC device, it is required to convert the basal plane dislocations 1A in the SiC single crystal substrate 1 into the threading edge dislocations 2B with high efficiency in a process of forming the epitaxial layer 2. As a timing when the basal plane dislocation is converted into the threading edge, as shown in FIG. 2A, it is preferable that the basal plane dislocation is converted into the threading edge dislocation 2B at the interface between the SiC single crystal substrate 1 and the epitaxial layer 2. It is required to suppress the basal plane dislocation from being converted into the threading edge dislocation 2B inside the epitaxial layer 2, as shown in FIG. 2C.

The basal plane dislocations 2A and the threading edge dislocations 2B can be identified from a shape of pits generated by selective-etching of a surface and images of dislocations obtained by X-ray topography. In addition, a detection can be performed using a photoluminescence image which is obtained based on photoluminescence light that is caused by defects when the defects are exposed to ultraviolet light. The basal plane dislocation 2A emits light having a wavelength of 700 nm or more when irradiated with ultraviolet light.

A position where the basal plane dislocation is converted into the threading edge dislocation can be confirmed by slicing the epitaxial layer in the thickness direction and measuring the basal plane dislocation by selective etching or the like performed on the sliced surface.

(Defect Caused by Si Droplet)

For the growth of SiC, an Si source and a C source are supplied at the same time. At that time, when Si excessively exists, Si droplets are generated, since Si, which does not contribute to growth, generates an aggregate. Furthermore, the Si droplets adhere to the growth surface, and the Si droplets aggregate on the growth surface. In a case where the Si droplets exist in a small amount, since the droplets re-evaporate after adhering, there is no problem. However, in a case where the Si droplets exist in a large amount, the droplets obstruct the progress of a step in the step flow growth before such a re-evaporation is caused, and the droplets are incorporated into the layer. As a result, the incorporated Si droplets cause defect generation.

The defects caused by the Si droplets are classified into two defects according to appearances. One is pits existing in a scattered manner, and the other is defects shown as a linear shape. The defects shown as a linear shape are a collective defect in which pits are arranged in a line. Therefore, the difference in whether the pits are scattered or collect is only confirmed from the external shape, and both are formed due to the Si droplets.

The defects caused by Si droplets are generated due to excessive Si in the growth atmosphere. Accordingly, the defect generation can be suppressed by setting C/Si ratio of raw material gas to high. However, the C/Si ratio also has an effect on other properties. Therefore, in order to obtain the SiC epitaxial layer which can be used in a device, the C/Si ratio is required to be set within a certain range for factors other than Si droplets.

Therefore, as a result of examining parameters which can suppress defects caused by Si droplets other than the parameter of the C/Si ratio, a film formation pressure during epitaxial growth was found as one of the parameters. Qualitatively, in a case where the growth pressure is low, the Si droplets adhering to the substrate re-evaporate, and it is difficult to form pits. FIGS. 3A to 3D are views showing examples of defects, which are caused by Si droplets existing on the surface of the SiC epitaxial wafers, which are prepared by changing the film formation pressure during growth while other conditions are the same, and are observed using a confocal differential interference contrast optical type surface inspection device.

Figure 3A:
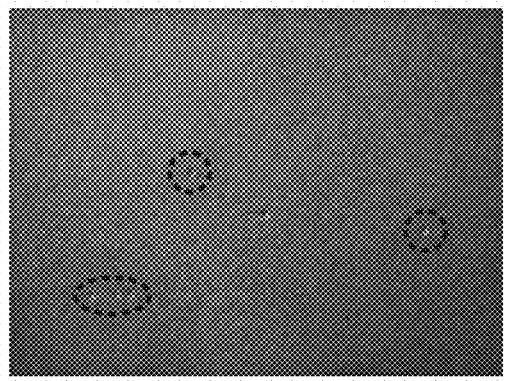
FIG. 3A is a confocal differential interference contrast microscope image of an epitaxial wafer surface when a growth pressure in a SiC epitaxial growth step is changed.

FIG. 3A shows a case where the growth pressure is 200 torr, and the defects (pits) caused by Si droplets are generated. In FIG. 3A, since the pits are difficult to see, the periphery of the pits is surrounded by a dotted line. Although threading screw dislocations and threading edge dislocations also cause small pits, the positions of the threading screw dislocations and the threading edge dislocations can be identified by selective etching, X-ray topography or the like, and therefore said small pits can be distinguished from pits caused by Si droplets. As shown in FIG. 3A, under the condition in which the pressure during the film formation is high (Si droplets are likely to be generated), the number of pits caused by Si droplets is large and the pits are also generated in a central portion of the wafer. Each of pits caused by Si droplet is isolated.

Figure 3B:
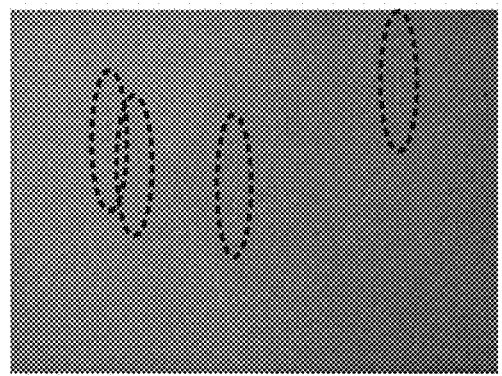
FIG. 3B is a confocal differential interference contrast microscope image of the epitaxial wafer surface when the growth pressure in the SiC epitaxial growth step is changed.

FIG. 3B shows a result of observing defects caused by Si droplets when the growth pressure is lowered to 100 torr. In FIG. 3B, since the defects are difficult to see, the periphery of the defects is surrounded by a dotted line. As shown in FIG. 3B, frequent occurrence of isolated typical pits caused by Si droplets was not observed, but it was confirmed that pits collect locally and a collective defect in which pits are arranged vertically is formed. The collective defect was particularly often generated on the outer peripheral of the substrate.

Figure 3C:
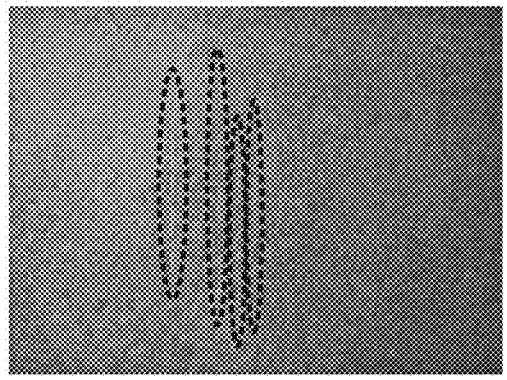
FIG. 3C is a confocal differential interference contrast microscope image of the epitaxial wafer surface when the growth pressure in the SiC epitaxial growth step is changed.

FIG. 3C shows a result of observing defects caused by Si droplets when the growth pressure is lowered to 50 torr. In FIG. 3C, since the defects are difficult to see, the periphery of the defects is surrounded by a dotted line. As shown in FIG. 3C, a collective defect having a feature in which pits are arranged vertically was observed.

The density of pits in the collective defect was decreased in a case where the pressure is lowered.

Figure 3D:
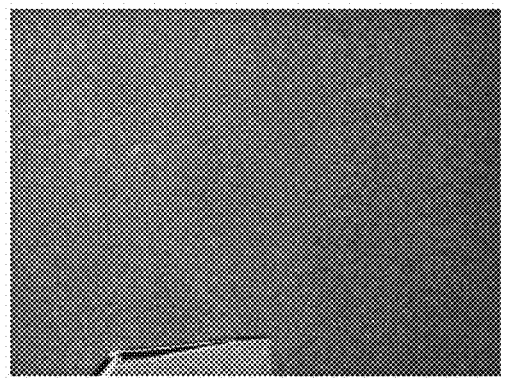
FIG. 3D is a confocal differential interference contrast microscope image of the epitaxial wafer surface when the growth pressure in the SiC epitaxial growth step is changed.

FIG. 3D shows a result of observing defects caused by Si droplets when the growth pressure is lowered to 25 torr. Neither isolated pits nor a collective defect vertically arranged is detected. In a case where there is no collective defect, the surface of the SiC epitaxial wafer is flat and it is difficult to focus on the surface. Therefore, the part where the foreign matter exists on a lower side in the photograph was captured, and the surface was focused.

The collective defect having the feature in which the pits are arranged vertically can be found for the first time, when the defects are focused on the shape thereof and scanned by a high-resolution type optical microscope. The reason why the typical pits are arranged vertically which are caused by the Si droplets and remain at the end after reducing the Si droplets can be understood as follows. The Si droplet is likely to be formed in a recessed portion on the epitaxial growth surface. In the step flow growth, an atomic step portion exists, and the atomic step portion is formed in a stepped shape. Therefore, the Si droplet is likely to move in and adhere to the portion. The atomic step exists in the in-plane direction orthogonal to an offset growth direction. Therefore, it is presumed that the Si droplets are easily dispersed and adhered in said direction, and a trace thereof becomes the collective defect in which the pits collect vertically. The direction in which the Si droplets are arranged vertically is a direction in which the step extends.

The defects caused by Si droplets include both the pits shown as isolated in a case where a relatively large number of defects exist and the collective defect which is shown in a case where the generation of defects is small and in which typical pits are arranged vertically. When counting the defects, each of isolated pits is counted as one defect, and the collective defect in which the pits are arranged vertically is counted as one line of arranged pits, thereby being quantified. Although the collective defect may be counted as the scattered pits depending on a measurement magnification, the collective defects are determined by whether the defects are shown as a line, when the defects are confirmed at a magnification of 50 times or more. An upper limit of the measurement magnification is suitably selected in a range of 1000 times or less.

In the parameters other than the C/Si ratio, one of the parameters having an effect on the generation of the pits caused by Si droplets is a growth rate of the epitaxial layer. In order to reduce the ratio of BPDs continued from the substrate to the epitaxial layer, it is preferable to increase the growth rate to a certain value or more. However, when the growth rate is increased, the flow rate of the Si-based gas is required to increase, which results in a condition in which the defects caused by Si droplets are likely to be generated.

Figure 4A:
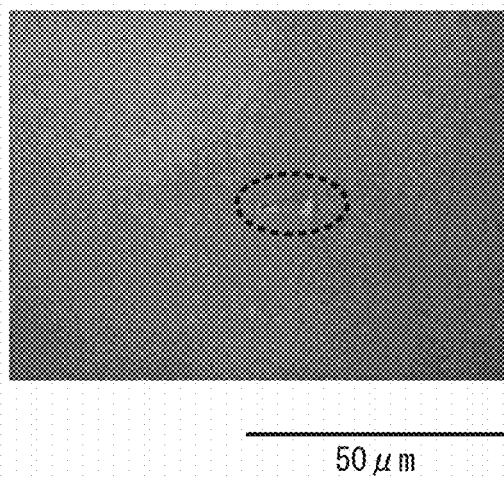
FIG. 4A is a confocal differential interference contrast microscope image of the epitaxial wafer surface when the growth rate in the SiC epitaxial growth step is changed.
Figure 4B:
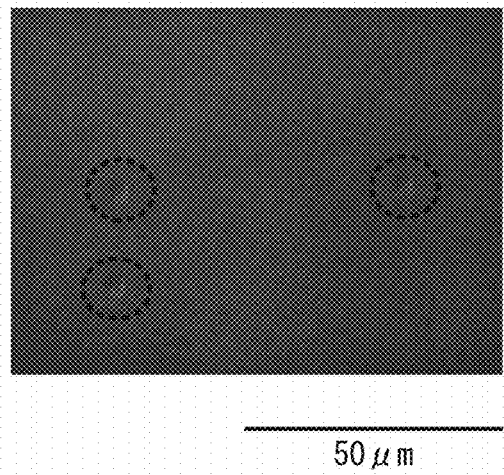
FIG. 4B is a confocal differential interference contrast microscope image of the epitaxial wafer surface when the growth rate in the SiC epitaxial growth step is changed.

FIGS. 4A to 4B are differential interference microscope images of the surface of the SiC epitaxial layer in a case where the growth rate is set to 40 μm/h, or the growth rate is set to 68 μm/h, in which other conditions are the same. In FIG. 4A, the defects caused by the threading screw dislocations are observed (in the dotted line region of FIG. 4A), but the defects caused by Si droplets are not observed. It is difficult to determine the defects caused by the threading screw dislocations only from the shape. Therefore, after capturing a picture, etching was performed to confirm the defects. On the other hand, when the growth rate is increased to 68 μm/h, as shown in FIG. 4B, the pits caused by Si droplets were generated as being scattered (in the dotted line region in FIG. 4B).

That is, increasing the growth rate is effective to convert the basal plane dislocation into the threading edge dislocation. However, the growth rate is required to be reduced in order to suppress the defects caused by Si droplets. In other words, it is difficult to suppress defects caused by Si droplets under the condition with the high growth rate which can reduce the basal plane dislocations.

Also, as shown in FIG. 2A, in order to convert the basal plane dislocations 1A into the threading edge dislocations 2B at the interface between the SiC single crystal substrate 1 and the epitaxial layer 2, it is effective to increase the growth rate immediately after the start of epitaxial growth. However, in this case, a large amount of silicon raw materials is supplied immediately after the start of growth, and as a result, the Si droplets are more likely to be generated. That is, when the conversion from the basal plane dislocations into the threading edge dislocations is controlled, suppressing the defects caused by the Si droplet is more difficult.

Therefore, in order to suppress the generation of defects caused by Si droplets under the condition in which the C/Si ratio and the growth rate are limited, the parameters other than the film formation pressure during growth are required to be controlled. As one means, method of flowing a gas containing Cl to the surface of the SiC single crystal substrate together with the raw material gas.

(Method for Producing SiC Epitaxial Wafer)

In a method for producing a SiC epitaxial wafer 10 according to the present embodiment includes a step of carrying out crystal growth of an epitaxial layer 2 on a SiC single crystal substrate 1 in which a main surface has an off-angle of 0.4° to 5° with respect to (0001) plane.

First, the SiC single crystal substrate 1 is prepared. Methods for preparing the SiC single crystal substrate 1 are not particularly limited.

For example, the SiC single crystal substrate can be obtained by slicing a SiC ingot obtained by a sublimation method or the like.

In the SiC single crystal substrate 1, a basal plane dislocation 1A exists along the (0001) plane (c-plane). The number of basal plane dislocations 1A exposed to a growth surface 1a of the SiC single crystal substrate 1 is preferably as small as possible, but is not particularly limited. At the current level of technology, the number of basal plane dislocations 1A existing on the surface (growth surface) of a SiC single crystal substrate 1 of 6-inch is about 1000 to 5000 per 1 cm$^2$.

Next, the epitaxial layer 2 is epitaxially grown on the SiC single crystal substrate 1 to prepare the SiC epitaxial wafer 10. The epitaxial layer 2 is obtained, for example, by step-flow growth (lateral growth from atomic step) on the growth surface 1a of the SiC single crystal substrate 1 by a chemical vapor deposition (CVD) method or the like.

The epitaxial growth is performed by flowing a raw material gas, a gas containing Cl element, a carrier gas and a dopant gas on the SiC single crystal substrate maintained at a high-temperature.

The "raw material gas" is a gas to be a raw material for forming a SiC epitaxial film. Generally, it is classified into an Si-based raw material gas containing Si in a molecule and a C-based raw material gas containing C in a molecule.

As the Si-based raw material gas, a well-known Si-based raw material gas can be used, and for example, silane ($SiH_4$) can be cited. In addition, a chlorine-based gas (chloride-based material) which includes an Si source and contains Cl having etching action can also be used such as dichlorosilane ($SiH_2Cl_2$), trichlorosilane ($SiHCl_3$), and tetrachlorosilane ($SiCl_4$). The C-based raw material gas can be optionally selected, and for example, propane ($C_3H_8$) or the like can be used.

The "gas containing Cl element" is a gas which contains Cl as a constituent element of molecules constituting the gas. The gas containing Cl can be optionally selected, and for example, hydrogen chloride (HCl), $SiH_2Cl_2$, $SiHCl_3$, $SiCl_4$, and the like are cited as the gas. Here, $SiH_2Cl_2$, $SiHCl_3$, and $SiCl_4$ are also the above-mentioned the Si-based raw material gas. As these gases, there are cases where the gas is a "gas containing a Cl element" as well as a "Si-based raw material gas".

The "dopant gas" is a gas which contains an element that becomes a donor or an acceptor. Nitrogen for growing N-type, trimethylaluminum (TMA) or triethylaluminum (TEA) for growing P-type and the like are used as the dopant gas. The dopant gas is usually fed together with the raw material gas. Since the flow rate of the dopant gas is generally small, unless otherwise specified, flowing the dopant gas is performed at the same time with flowing the raw material gas, and the amount of the dopant gas is appropriately adjusted.

As other usable gas, there is a carrier gas for transporting the gases into a reaction furnace. Inert hydrogen is preferably used as the carrier gas. An atmosphere or a film formation atmosphere means a state of gas in a growth furnace. For this reason, said atmosphere can mean the state containing hydrogen gas, but hydrogen does not directly affect an epitaxial growth reaction.

The C/Si ratio is a ratio of the flow rate of C element to the flow rate of Si element in the flowing raw material gas. In the epitaxial growth in which normal doping is performed, since an amount of element used as a dopant is smaller than an amount of Si and C, the C/Si ratio is determined by a ratio of the raw material gases.

The Cl/Si ratio is a ratio of the flow rate of Cl element and the flow rate of Si element contained in all the growth gases.

As described above, the gas containing the Cl element may also serve as the Si raw material gas. In this case, the Cl element in the Si raw material gas is also included in the amount of Cl element, which is contained in all the gases used for growing. This is because the Si raw material gas containing Cl is easily decomposed at a high-temperature which corresponds to the epitaxial growth region and releases Cl element.

When the C/Si ratio and the Cl/Si ratio are defined, all ratios of Si, C and Cl are determined. Further, when the C/Si ratio is determined, the growth rate is set on the basis of the flow rates of Si and C. That is, determining the growth rate, the C/Si ratio, and the Cl/Si ratio is to define the conditions of elements which contribute to the growth.

In the SiC epitaxial wafer manufacturing method according to the present embodiment, the C/Si ratio, the Cl/Si ratio, the film formation pressure, and the growth rate in the epitaxial growth step are set. Furthermore, before the epitaxial growth step, it is preferable to perform a cleaning step of cleaning the surface of the SiC single crystal on which the epitaxial film is grown.

In the cleaning step, after disposing the SiC single crystal substrate in the CVD apparatus, hydrogen as a carrier gas flows, and the temperature is raised while maintaining a predetermined pressure. In a reduced pressure state, the surface of the SiC single crystal substrate is exposed to high-temperature hydrogen gas so as to be cleaned. The temperature at which the surface is cleaned can be optionally selected, and it is preferably 1550° C. or higher and 1650° C. or lower, and preferably 5 minutes or longer and 60 minutes or shorter. The pressure in the cleaning step is preferably 30 torr (4 kPa) or less, and more preferably in a range of 15 torr to 30 torr (2 kPa to 4 kPa). When the pressure is too low, discharge is likely to occur in the epitaxial device. Therefore, the pressure in the cleaning step is preferably set to 15 torr or more.

Next, an epitaxial growth step is performed. In the epitaxial growth step, a flow rate of the Si-based raw material gas and a flow rate of the C-based raw material gas are preferably a flow rate at which the growth rate of the SiC epitaxial layer is 50 μm/h or more, and more preferably a flow rate at which the growth rate is 60 μm/h or more. The upper limit of the growth rate is not particularly limited, but may be, for example, a flow rate at which the growth rate is 300 μm/h or less, or a flow rate at which the growth rate is 200 μm/h or less.

By increasing the growth rate from the initial growth stage, the basal plane dislocations of the SiC single crystal substrate can be converted into the threading edge dislocations with high efficiency at the interface between the SiC single crystal substrate and the epitaxial layer. That is, it is possible to suppress the conversion of the type shown in FIG. 2C in which the basal plane dislocation is converted into the threading edge dislocation after the basal plane dislocation penetrates in the epitaxial layer. Here, the initial growth stage refers to a time point when the raw material gas starts to be fed, and the growth rate is a growth rate which can be determined from the flow rate. That is, setting the growth rate to a predetermined value from the initial growth stage means that the condition at which the raw material gas starts to be fed is set to a condition in which the growth rate becomes a predetermined value.

In a case where a growth period in which the growth rate is 50 μm/h or more is provided in the epitaxial growth step, the basal plane dislocation density 2A of the basal plane dislocation extending from the SiC single crystal substrate 1 without being converted into the threading edge dislocations 2B can be 0.1 dislocations/cm$^2$ or less even in the SiC epitaxial wafer 10 of 6-inch or more. Furthermore, when growth is performed at the growth rate of 50 μm/h or more from the initial growth stage, a total basal plane dislocation density of the basal plane dislocation in the area lying from the SiC single crystal substrate to the outer surface and the basal plane dislocation converted into the threading edge dislocation in the epitaxial layer can be 0.1 dislocations/cm$^2$ or less.

Here, in the SiC epitaxial wafer 10 of "6-inch or more", it is very important that the basal plane dislocation density 2A of the basal plane dislocation which extends from the SiC single crystal substrate 1 without being converted into the threading edge dislocations 2B is 0.1 dislocations/cm$^2$ or less. In the conventional SiC epitaxial wafer of 4-inch or less, a SiC epitaxial wafer in which the basal plane dislocation density is relatively low is being reported. However, there is no such report on a SiC epitaxial wafer of 6-inch or more. In the SiC epitaxial wafer of 6-inch or more, there is a variation of film forming conditions of the SiC single crystal substrate, and thus it is difficult to obtain the same result as 4-inch.

In the SiC epitaxial wafer 10 of 4-inch or less, in a case where the growth rate of the epitaxial layer 2 is less than 50 μm/h, there is a case where the basal plane dislocation density is 0.1 dislocations/cm$^2$ or less. Examples of the case includes a case where the number of basal plane dislocations 1A of the SiC single crystal substrate 1 itself is small, or a case where the film forming conditions are fixed under specific conditions.

However, in practice, a state of the SiC single crystal substrate 1 is not identical, and is different for each batch or wafer. In addition, the film forming conditions also need to be changed for various reasons. Therefore, it is difficult to stably reduce the basal plane dislocation density even in the SiC epitaxial wafer 10 of 4-inch or less.

In addition, a small number of basal plane dislocations in the SiC single crystal substrate are more advantageous for reducing the basal plane dislocations which extend into the epitaxial layer. However, it is difficult to produce a SiC single crystal substrate having a small number of basal plane dislocations, and a SiC single crystal substrate of 6 inches or more having a small number of basal plane dislocations is very expensive. When the growth rate of the epitaxial layer is set to 60 μm or more, the efficiency of converting the basal plane dislocations into threading edge dislocations can be 99.995% or more. Therefore, even if a SiC single crystal substrate of basal plane dislocations of 5000 to 1000 per 1 cm$^2$ is used at a relatively reasonable price, the basal plane dislocations in the epitaxial layer can be reduced to 0.1 dislocations/cm$^2$ or less.

When comprehensively considering suppression of crystal defects, the C/Si ratio is preferably set to 0.8 to 1.2. In addition, it is preferable that the film formation pressure in the epitaxial growth step is the same pressure as in a chamber pressure in the cleaning step of the SiC substrate. In a case where said pressures are the same, there is no gas flow disturbance which is caused by pressure fluctuation. Therefore, the generation of Si droplets or the like can be suppressed.

The generation of Si droplets can be prevented, when a gas containing Cl element starts to flow at the same time. When the C/Si ratio is large, it may be considered that Si in the film formation environment is not excessive, so that Si droplets are not generated. However, generation of the Si droplets is caused by fluctuation of the raw material ratio in the growth space. Therefore, even though the C/Si ratio is controlled to an appropriate value close to 1, the local generation of Si droplets caused by the fluctuation of the raw material ratio is difficult to completely be suppressed. Particularly, in epitaxial growth which is performed on a large-diameter substrate of 6 inches or more, a local variation in the raw material ratio is likely to occur, and complete elimination thereof is difficult. The generation of Si droplets over the entire surface of the SiC substrate can be suppressed, when the gas containing Cl element flows so that the Cl/Si ratio becomes a certain level or more at the same time with the flow of the raw material gas.

Here, "at the same time" means a state where an Si-based raw material gas, a C-based raw material gas, and a gas containing Cl element are flowing at a predetermined flow rate at a time when growth substantially starts. Even though a specific gas is flowed for a short time or in a small amount before the growth starts, it is allowed as long as the growth is not performed and the substrate surface is not affected.

The Cl/Si ratio is 8 or more. The generation of Si droplets can be reliably suppressed by setting the Cl/Si ratio within the above range. The Cl/Si ratio is affected by the growth rate and growth temperature. However, in a case where the Cl/Si ratio is larger than 6, the generation of Si droplets is suppressed, and in a case where the Cl/Si ratio is 8 or more, the generation of Si droplets can be suppressed to have a predetermined value or less. The Cl/Si ratio can have a value larger than 3 by flowing together with the Si raw material gas and the gas containing Cl element but not containing Si. In a case of using trichlorosilane as the Si raw material gas, the Cl/Si ratio in the gas composition is 3, but the Cl/Si ratio can be larger than 6 by adding HCl.

In addition, the Cl/Si ratio is preferably 12 or less, and more preferably 10 or less. When the Cl/Si ratio is too large, trapezoidal defects are generated, or the surface roughness is increased to deteriorate the morphology. Furthermore, when the amount of Cl to be used increases, a load on a growth device increases, and exhaust gas treatment also becomes expensive.

Figure 5A:
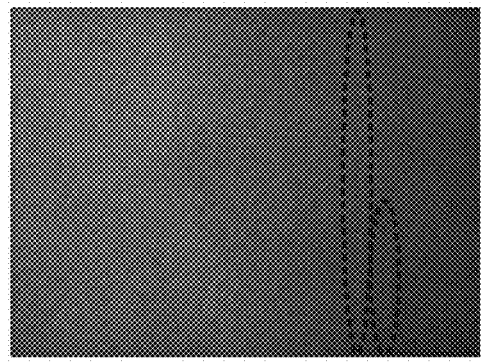
FIG. 5A is a confocal differential interference contrast microscope image of the epitaxial wafer surface when a Cl/Si ratio in the SiC epitaxial growth step is changed.
Figure 5B:
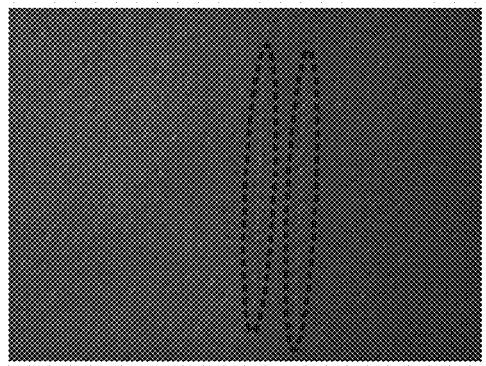
FIG. 5B is a confocal differential interference contrast microscope image of the epitaxial wafer surface when the Cl/Si ratio in the SiC epitaxial growth step is changed.
Figure 5C:
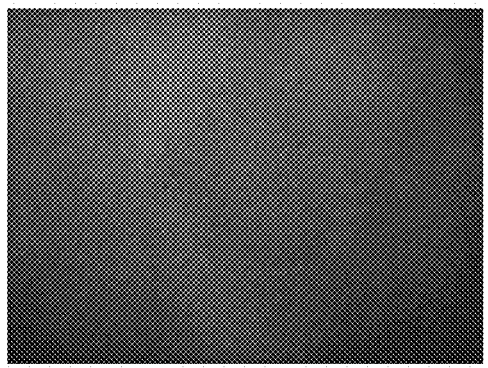
FIG. 5C is a confocal differential interference contrast microscope image of the epitaxial wafer surface when the Cl/Si ratio in the SiC epitaxial growth step is changed.

FIGS. 5A to 5C are differential interference microscopic images of the surface of the SiC epitaxial wafers grown at a changed Cl/Si ratio. Epitaxial growth was performed using trichlorosilane as the Si-based raw material gas, propane as the C-based raw material gas, and HCl gas as the chlorine-based gas. The growth temperature was 1600° C., the C/Si ratio was 1, and the growth rate was 60 μm/h.

FIG. 5A shows a case where HCl/trichlorosilane is 1 and the Cl/Si ratio is 4. Collective defects in which pits caused by Si droplets occurs in a line were confirmed (in the regions surrounded by the dotted line in the figure).

FIG. 5B shows a case where HCl/trichlorosilane is 3 and the Cl/Si ratio is 6. Regarding the Si droplets, the pits caused by Si droplets is less than in the case of FIG. 5A, and therefore the effect of increasing the Cl/Si ratio appeared. However, some collective defects caused by Si droplets occurred in the wafer (in the regions surrounded by the dotted line in the figure).

FIG. 5C shows a case where HCl/trichlorosilane is 5 and the Cl/Si ratio is 8. No defects caused by Si droplets were confirmed.

In a case where the Cl/Si ratio is further increased, for example, a case where the Cl/Si ratio is 19, trapezoidal defects were generated. The trapezoidal defect is a typical defect that degrades the surface morphology at a high Cl/Si ratio. The trapezoidal defect is a defect having a trapezoidal shape in a surface view, and is a defect which has an upper base, wherein the upper base is a defect extending in a direction perpendicular to an offset direction of the substrate, that is, extending in a direction of step, and is formed to continue to the epitaxial growth layer. The trapezoidal defect is caused by a defect such as dislocations existing in the substrate, and the defect is generated by selectively performing local etching before epitaxial growth.

That is, when the Cl/Si ratio is too high, the surface of the substrate is in a state of being etched in the initial growth stage, and a trapezoidal defect is likely to be generated. Furthermore, the deterioration of the morphology in a case of the Cl/Si ratio being high can be measured using AFM or the like as the surface roughness.

The gas containing the Cl element and the raw material gas preferably start to flow at the same time. In a case where a gas containing Si and Cl is used for the Si-based raw material gas, Si and Cl are supplied at the same time. Therefore, it is preferable that the gas containing Cl element also serves as the Si-based raw material gas.

Even in a case where the gas containing Cl element also serves as the Si-based raw material gas, in order to set the Cl/Si ratio to 8 or more, it is required to flow the Cl-based gas not containing Si, such as HCl. In this case, it is preferable that the Cl-based gas not containing Si starts to flow together with other raw material gas at the same time, so that a certain amount of Cl exists on the substrate at the same time with the start of growth but there is no Cl before the growth. If the Cl-based gas exists before the growth starts, the risk in which the surface of the substrate is etched increases. If the surface of the substrate is etched, the trapezoidal defects may be generated, or the surface roughness increases, thereby the morphology deteriorating.

As described above, in the method for producing the SiC epitaxial wafer according to the present embodiment, by increasing the growth rate, the conversion efficiency from the basal plane dislocation 1A into the threading edge dislocation 2B is increased, and then the basal plane dislocation density of the basal plane dislocation extending from the SiC single crystal substrate 1 in the epitaxial wafer without being converted into threading edge dislocations 2B can be 0.1 dislocations/cm$^2$ or less.

In addition, by setting the growth rate to a predetermined rate or higher, the basal plane dislocation density can be stably set to 0.1 dislocations/cm$^2$ or less with high reproducibility even under another SiC single crystal substrate or another film forming condition.

In addition, the density of defects which are caused by Si droplets can be reduced to 0.1 defects/cm$^2$ or less, since the generation of defects caused by Si droplets is suppressed by starting the growth such that the raw material gas and the gas containing the Cl element are fed at the same time at the C/Si ratio and Cl/Si ratio which have certain conditions.

Furthermore, by setting the Cl/Si ratio to a predetermined value or more, an epitaxial wafer having no defects caused by Si droplets can be manufactured.

(SiC Epitaxial Wafer)

A SiC epitaxial wafer according to the present embodiment can be obtained by using the above described manufacturing method.

The SiC epitaxial wafer according to the present embodiment includes the SiC single crystal substrate 1 and the SiC epitaxial layer 2 as shown in FIG. 1.

In the SiC single crystal substrate 1, the main surface has an off-angle of 0.4° to 5° with respect to (0001) plane. In a case where the off-angle is in the above range, the epitaxial layer 2 can be grown while maintaining the off-angle required for the device.

The basal plane dislocation density of the basal plane dislocation in an area lying from the SiC single crystal substrate 1 of the epitaxial layer 2 to the outer surface is 0.1 dislocations/cm$^2$ or less, and the defects caused by Si droplets are 0.1 defects/cm$^2$ or less. According to producing conditions, the number of defects caused by Si droplets can be reduced to zero.

The basal plane dislocations are detected by a photoluminescence method. By using light having a wavelength of 400 nm or less as excitation light, a linear defect is detected as the basal plane dislocation, wherein the linear defect extends in the step-flow direction in epitaxial growth and glows with the light having a wavelength of 700 nm. Measurement is performed on the entire surface of the wafer. Specifically, the measurement is performed on an area of 80% or more of the wafer excluding the outer peripheral end. The number of basal plane dislocations detected in the SiC epitaxial wafer is counted and divided by the area of the SiC epitaxial wafer to obtain the basal plane dislocation density.

The defects caused by Si droplets are detected by a confocal differential interference contrast microscope having a magnification of 20 times or more. The defects caused by Si droplets include both cases of isolated pits and a typical collective defect in which pits are arranged vertically. Each isolated pit is counted as one, and a collective defect is counted as one line of arranged pits, thereby being quantified. The measurement is performed on the entire surface of the wafer in the same manner as the measurement of the basal plane dislocation. Then, the number of detected defects caused by Si droplets in the SiC epitaxial wafer is counted, and the number is divided by the area of the SiC epitaxial wafer to obtain density of the defects caused by Si droplets.

The diameter of the SiC single crystal substrate is preferably 150 mm or more (6-inch or more). It is important that the SiC epitaxial wafer has 6-inch or more. This is because the number of SiC devices that can be manufactured from a single SiC epitaxial wafer can be increased, and the cost of the SiC devices can be reduced. The SiC device has a problem that they are very good in performance but higher in cost compared to Si devices. Therefore, a large-sized SiC device having the low basal plane dislocation density leads to a significant cost reduction.

The thickness of the epitaxial layer is not limited, but preferably 10 μm or more.

The shape of the SiC epitaxial wafer is not particularly limited. The shape of the SiC epitaxial wafer may be a circle or a shape provided with a notch such as an orientation flat (OF), which are generally used.

In the SiC epitaxial wafer according to the present embodiment, an amount of the defects caused by Si droplets and the basal plane dislocations (BPD), which result in the killer device defects of the SiC device in the epitaxial layer, is small, and therefore the quality of the SiC device is increased.

In addition, in a module for automobiles and the like, a large current of 100 A-class is used in one device. Therefore, a SiC chip (a substrate of the SiC device) thereof which is produced from a SiC epitaxial wafer has a large size such as 10 mm square. In such a large-sized SiC chip, reduction of the basal plane dislocation density is extremely important since an effect of decreasing the basal plane dislocation density on the yield is extremely high.

EXAMPLES

Hereinafter, examples of the present invention will be described. However, the present invention is not limited thereto.

Example 1

A 6-inch SiC single crystal substrate was prepared. The prepared SiC single crystal substrate is a 4H polytype, and a main surface thereof includes an Si surface having an offset-angle of 4° in <11-20> direction from (0001) plane.

Next, the SiC single crystal substrate was introduced into a growth furnace, and a cleaning step of performing gas etching on a growth surface using hydrogen gas was performed. An etching temperature was set to 1600° C. same as the epitaxial growth temperature, and the pressure was set to 30 torr.

Next, while supplying hydrogen to the surface of the etched 4H—SiC single crystal substrate and maintaining the same pressure, feeding of trichlorosilane and propane as raw material gases and HCl as a gas containing Cl element was started at the same time to grow an epitaxial layer.

In the epitaxial growth step, the ratio of the C-based raw material gas to the Si-based raw material gas was set to the C/Si ratio of 1.0, and the gas flow rate was set to the growth rate of 50 μm/h.

The flow rates of trichlorosilane and HCl were set so that the Cl/Si ratio is 8. Under this condition, the SiC epitaxial layer was grown to 10 μm.

The basal plane dislocation density of the prepared SiC epitaxial wafer was evaluated using (a photoluminescence imaging apparatus manufactured by Photon Design Co. Ltd.). In addition, pits caused by Si droplets were counted by a confocal differential interference contrast optical type surface inspection apparatus (SICA). The basal plane dislocations were 0.02 dislocations/cm$^2$ (3 pieces/wafer), and the pits caused by Si droplets were 0.03 pits/cm$^2$ (6 pieces/wafer).

Example 2

Example 2 was the same as Example 1 except that the Cl/Si ratio was set to 10. The basal plane dislocation density of the obtained SiC epitaxial wafer was evaluated. The basal plane dislocations were 0.04 dislocations/cm$^2$, and there were no pits caused by Si droplets.

Example 3

Example 3 was the same as Example 1 except that the growth rate was set to 65 μm/h. The basal plane dislocation density of the obtained SiC epitaxial wafer was evaluated. The basal plane dislocations were 0.01 dislocations/cm$^2$, and pits caused by Si droplets were 0.053 pits/cm$^2$.

Comparative Example 1

Comparative Example 1 is different from Example 1 in that the growth rate was 45 μm/h. The other conditions were the same as in Example 1. The basal plane dislocation density of the obtained SiC epitaxial wafer was evaluated. The basal plane dislocations were 8 dislocations/cm$^2$ and the pits caused by Si droplets were 0.02 pits/cm$^2$.

Comparative Example 2

Comparative Example 2 is different from Example 1 in that HCl does not flow and the Cl/Si ratio is 3. The other conditions were the same as in Example 1. The basal plane dislocation density of the obtained SiC epitaxial wafer was evaluated. The basal plane dislocations were 0.01 dislocations/cm$^2$ and the pits caused by Si droplets were 10 pits/cm$^2$.

TABLE 1

| | Growth rate (μm/h) | C/Si ratio | Cl/Si ratio | Basal plane dislocation density (Dislocations/cm$^2$) | Density of defect caused by Si droplet (Defects/cm$^2$) |
|---|---|---|---|---|---|
| Example 1 | 50 | 1 | 8 | 0.02 | 0.03 |
| Example 2 | 50 | 1 | 10 | 0.04 | 0 |
| Example 3 | 65 | 1 | 8 | 0.01 | 0.05 |
| Comparative Example 1 | 45 | 1 | 8 | 8 | 0.02 |
| Comparative Example 2 | 60 | 1 | 3 | 0.01 | 10 |

INDUSTRIAL APPLICABILITY

According to the present invention, it is possible to obtain a SiC epitaxial wafer having a small number of basal plane dislocations (BPD) causing device killer defects and a small number of defects caused by Si droplets, and a method for producing the same.

REFERENCE SIGNS LIST

1 SiC single crystal substrate
2 Epitaxial layer

10 SiC epitaxial wafer
1a Growth surface
1A, 2A Basal plane dislocation
2B Threading edge dislocation

The invention claimed is:

1. A SiC epitaxial wafer comprising:
a SiC single crystal substrate of which a main surface has an off-angle of 0.4° to 5° with respect to (0001) plane; and
an epitaxial layer provided on the SiC single crystal substrate,
wherein in the epitaxial layer, a basal plane dislocation density of a basal plane dislocation which continues from the SiC single crystal substrate to an outer surface is 0.1 dislocations/cm$^2$ or less, and a defect density caused by Si droplets is 0.1 defects/cm$^2$ or less, and
wherein a total basal plane dislocation density of the basal plane dislocation which continues from the SiC single crystal substrate to the outer surface and a basal plane dislocation which is converted into a threading edge dislocation in the epitaxial layer is 0.1 dislocations/cm$^2$ or less.

2. The SiC epitaxial wafer according to claim 1, the defect caused by the Si droplets is pits which exist in a scattered manner, and/or a collective defect in which pits are arranged in a direction perpendicular to an off-direction in an in-plane direction of the SiC single crystal substrate.

3. The SiC epitaxial wafer according to claim 2, wherein the defect density caused by Si droplets is zero defects/cm$^2$.

4. The SiC epitaxial wafer according to claim 1, wherein a diameter of the SiC single crystal substrate is 150 mm or more.

5. A method for producing a SiC epitaxial wafer in which crystal growth of an epitaxial layer is carried out on a SiC single crystal substrate of which a main surface has an off-angle of 0.4° to 5° with respect to (0001) plane, the method comprising:
an epitaxial growth step of growing the epitaxial layer on the SiC single crystal substrate by feeding an Si-based raw material gas, a C-based raw material gas, and a gas including a Cl element to a surface of the SiC single crystal substrate,
wherein the epitaxial growth step is performed under growth conditions that a film deposition pressure is 30 torr or less, a Cl/Si ratio is in a range of 8 to 12, a C/Si ratio is in a range of 0.8 to 1.2, and a growth rate is 50 μm/h or more from an initial growth stage.

6. The method for producing a SiC epitaxial wafer according to claim 5, further comprising:
a cleaning step of cleaning a surface of the SiC single crystal substrate by heating the surface to 1550° C. to 1650° C. in a hydrogen atmosphere under a pressure of 30 torr or less, before the epitaxial growth step.

7. The method for producing a SiC epitaxial wafer according to claim 5, wherein the gas including the Cl element serves as the Si-based raw material gas.

* * * * *